United States Patent
Hwang

(10) Patent No.: US 7,268,009 B2
(45) Date of Patent: Sep. 11, 2007

(54) METHOD FOR FABRICATING A CMOS IMAGE SENSOR

(75) Inventor: Joon Hwang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 11 days.

(21) Appl. No.: 11/025,379

(22) Filed: Dec. 28, 2004

(65) Prior Publication Data
US 2006/0046341 A1   Mar. 2, 2006

(30) Foreign Application Priority Data
Aug. 24, 2004   (KR) .................... 10-2004-0066697

(51) Int. Cl.
*H01L 21/00*   (2006.01)
(52) U.S. Cl. .......................... 438/70; 438/48
(58) Field of Classification Search .................. 438/70, 438/48
See application file for complete search history.

(56) References Cited
U.S. PATENT DOCUMENTS
6,506,619 B2 *   1/2003   Chen et al. .................... 438/48

FOREIGN PATENT DOCUMENTS
KR   10-2000-0003929   1/2000
KR   10-2003-0073985   9/2003

OTHER PUBLICATIONS

Jao Gap Kim; Method for Fabricating Semiconductor Device for Image Sensor; Korean Patent Abstracts; KR 1020030073985 A; Sep. 19, 2003; Donghu Electronics Co., Ltd.
Seong Cheol Bylin; Method for Manufacturing an Image Sensor for Protecting a Surface of Pad Metal; KR 1020000003929 A; Jan. 25, 2000; Hyundai Electronics Inc. Co, Ltd.

* cited by examiner

*Primary Examiner*—Douglas M. Menz
(74) *Attorney, Agent, or Firm*—Andrew D. Fortney

(57) ABSTRACT

A method for fabricating a complementary metal-oxide semiconductor (CMOS) image sensor is disclosed. An example method forms a metal pad in a pad area of a substrate having an active area and a pad area defined thereon, forms a protective layer on an entire surface of the substrate including the metal pad and selectively removing the protective layer to open the metal pad, and forms a barrier layer having a predetermined thickness on the entire surface of the substrate including the opened metal pad. Additionally, the exampled method forms red, green, and blue color filter layers on the barrier layer corresponding to the active area, forms a micro-lens over each of the color filter layers, and removes the barrier layer on the pad area.

20 Claims, 6 Drawing Sheets

METHOD FOR FABRICATING A CMOS IMAGE SENSOR

RELATED APPLICATION

This application claims the benefit of the Korean Patent Application No. 10-2004-0066697, filed on Aug. 24, 2004, which is hereby incorporated herein by reference in its entirety.

TECHNICAL FIELD

The present disclosure relates to a semiconductor device and, more particularly, to a method for fabricating a complementary metal-oxide semiconductor (CMOS) image sensor.

BACKGROUND

Generally, an image sensor is a semiconductor device that converts an optic image to an electric signal. More specifically, a charge coupled device (CCD) is a device having a plurality of metal-oxide semiconductor (MOS) capacitors each formed within a proximate range from one another, and wherein a carrier electric charge is stored in and transmitted to each capacitor.

A charged coupled device (CCD) includes a plurality of photodiodes (PD), a plurality of vertical charge coupled devices (VCCDs), a horizontal charge coupled device (HCCD), and a sense amplifier. Herein, the photodiodes converting light signals to electric signals are aligned in a matrix form. The vertical charge coupled devices are formed between each of the photodiodes aligned in a matrix form and formed in a vertical direction to transmit electric charges generated from each photodiode in a vertical direction. The horizontal charge coupled device transmits the charges transmitted from the vertical charge coupled device in a horizontal direction, and the sense amplifier senses the charge transmitted in the horizontal direction and outputs the electric charges.

However, the above-described CCD is disadvantageous in that it has a complicated driving method, consumes a large amount of energy, and requires multiple photo processes, which complicates the fabrication process. In the CCD, a control circuit, a signal processing circuit, and an A/D converter circuit cannot be easily integrated to the CCD and, as a result, the device cannot be formed in a compact size.

Recently, to overcome such disadvantages of the CCD, a CMOS image sensor is considered to be the next generation image sensor. The CMOS image sensor adopts a CMOS technology, which uses the control circuit and the signal processing circuit as peripheral devices. The CMOS technology forms MOS transistors corresponding to the number of unit pixels on a semiconductor substrate. The CMOS image sensor is a device using a switching method that can sequentially detect the output of each unit pixel by using the MOS transistors. More specifically, by forming a photodiode and MOS transistors in each of the unit pixels, the CMOS image sensor can sequentially detect the electric signals of each unit pixel by using the switching method, thereby representing an image.

Also, because the CMOS image sensor uses the CMOS fabrication technology, the CMOS image sensor consumes less amount of energy, and uses a relatively simple fabrication process due to a smaller number of photo processes. Furthermore, in the CMOS image sensor, a control circuit, a signal processing circuit, an A/D converter circuit, etc., can be integrated to the CMOS image sensor chip, thereby allowing the CMOS image sensor to be formed in a compact size. Therefore, the CMOS image sensor is widely used in various applications, such as digital still cameras, digital video cameras, and the like.

Meanwhile, the CMOS image sensor can be divided into a 3-transistor (3T) type, a 4-transistor (4T) type, and a 5-transistor (5T) type CMOS image sensor depending upon the number of transistors used. The 3T type includes one photodiode and three transistors. The 4T type includes one photodiode and four transistors. And, the 5T type includes one photodiode and five transistors. An equivalent circuit and a layout of a unit pixel of the 3T type CMOS image sensor will now be described in detail.

FIG. 1 illustrates an equivalent circuit diagram of a known CMOS image sensor, and FIG. 2 illustrates a layout diagram of a known CMOS image sensor. As shown in FIG. 1, a unit pixel of the general 3T type CMOS image sensor includes one photodiode (PD) and three nMOS transistors (T1, T2, and T3). A cathode of the photodiode (PD) is connected to a drain of a first NMOS transistor (T1) and to a gate of a second NMOS transistor (T2). A source of each of the first and second transistors (T1 and T2) is connected to a power line, which provides a reference voltage (VR). A gate of the first NMOS transistor (T1) is connected to a reset line, which supplies a reset signal (RST). Also, a source of a third nMOS transistor (T3) is connected to a drain of the second NMOS transistor (T2). A drain of the third NMOS transistor (T3) is connected to a reader circuit (not shown) through a signal line. A gate of the third NMOS transistor (T3) is connected to a column select line, which provides a select signal (SLCT). Therefore, the first NMOS transistor (T1) will be referred to as a reset transistor (Rx), the second nMOS transistor (T2) will be referred to as a driver transistor (Dx), and the third NMOS transistor (T3) will be referred to as a select transistor (Sx).

Referring to FIG. 2, in the unit pixel of the general 3T type CMOS transistor, a photodiode 20 is formed on an active area and, most particularly, on a portion of the active area having a larger width. Gate electrodes 120, 130, and 140 of three transistors overlapping one another are formed on the remaining portions of the active area. More specifically, the gate electrode 120 forms the reset transistor (Rx), the gate transistor 130 forms the driver transistor (Dx), and the gate electrode 140 forms the select transistor (Sx). Herein, impurity ions are injected in the active area 10 of each transistor, except for the lower portions of the gate electrodes 120, 130, and 140, to form a source/drain area of each transistor. Therefore, a power voltage Vdd is applied to the source/drain area between the reset transistor (Rx) and the driver transistor (Dx), and a source/drain area on one side of the select transistor (Sx) is connected to the reader circuit (not shown).

As described above, although not shown in the drawings, each of the gate electrodes 120, 130, and 140 is connected to each signal line, and each of the signal lines is provided with a pad on one end to be connected to an external driving circuit. The signal lines provided with the pads and the following fabrication process will now be described in detail.

FIGS. 3A to 3E illustrate cross-sectional views of each signal line of a known CMOS image sensor and process steps of fabricating the known CMOS image sensor after forming the signal lines. Referring to FIG. 3A, an insulating layer 101 (e.g., an oxide layer), such as a gate insulating layer or an interlayer dielectric, is formed on a semiconductor substrate 100, and a metal pad 102 of each signal line is formed on the insulating layer 101. As shown in FIG. 2, the metal pad 102 may be formed of the same material as the gate electrodes 120, 130, and 140 and formed on the same layer. Alternatively, the metal pad 102 may also be formed of a different material through a separate contact and is usually formed of aluminum (Al). Also, a protective layer 103 is formed on an entire surface of the insulating layer 101 including the metal pad 102.

As shown in FIG. 3B, a photosensitive layer 104 is formed on the protective layer 103 and the photosensitive layer 104 is exposed and developed by using a photolithography process, thereby exposing an upper portion of the metal pad 102. Then, the protective layer 103 is selectively etched by using the photosensitive layer 104 as a mask to form an opening 105 on the metal pad 102. Finally, the photosensitive layer 104 is removed.

Referring to FIG. 3C, a first planarization layer 106 is deposited on the entire surface of the protective layer 103. Also, by treating the first planarization layer 106 with a photo-etching process by using a mask, only the portion of the metal pad region is removed. Then, a blue color filter layer 107, a green color filter layer 108, and a red color filter layer 109 are serially formed on the first planarization layer 106 corresponding to each photodiode area (not shown). In this example, the color filter layers are formed by depositing the photoresist of the corresponding color and then treating the photoresist with a photo-etching process using a separate mask.

As shown in FIG. 3D, a second planarization layer 111 is formed on the entire surface of the substrate including the color filter layers 107, 108, and 109 and then the second planarization layer 111 is treated with a photo-etching process using a mask so that the second planarization layer 111 remains only on the portion excluding the metal pad region. Referring to FIG. 3E, a micro-lens 112 corresponding to each of the color filter layers 107, 108, and 109 is formed on the second planarization layer 111. Furthermore, the CMOS image sensor fabricated by the above-described method is tested with a probe test in order to check contact resistance. Then, when no problem is detected, the metal pad is electrically connected to the external driving circuit.

However, the above-described known CMOS image sensor and the method for fabricating the same have the following disadvantages. After forming the opening on the metal pad, the first planarization layer, the red (R), green (G), and blue (B) color filter layers, the second planarization layer, and the micro-lens are sequentially formed. Thus, the later processes are carried out while the metal pad is exposed. Accordingly, due to the later processes, the metal pad may be damaged by an alkali solution of a TMAH group, which modifies the metal pad to a hard-type aluminum (Al), thereby increasing the contact resistance, which results in a greater number of failures when carrying out the probe test.

Also, when carrying out the probe test, a deep probing process may be performed, which cuts out the surface of the metal pad in order to reduce the contact resistance. In this case, a large number of the metal pad particles may be generated, which incapacitates the functions of the photodiode, thereby reducing product yield.

In the above-described known image sensor fabrication method, the opening on the metal pad may be formed after forming the micro-lens. However, the color filter layers are formed of photosensitive materials. As a result, when the opening on the metal pad is formed by using a photo-etching process after forming the micro-lens, the color filter layers may be damaged. Therefore, it may not be possible to form the opening on the metal pad after forming the micro-lens.

DETAILED DESCRIPTION

In general, the example methods and apparatus described herein provide a complementary metal-oxide semiconductor (CMOS) image sensor. In particular, in one example, after forming an opening on a metal pad, a barrier layer is formed in the metal pad contact hole to protect the metal pad from later processes, thereby reducing contact resistance and enhancing product yield.

One example method includes forming a metal pad in a pad area of a substrate having an active area and a pad area defined thereon, forming a protective layer on an entire surface of the substrate including the metal pad and selectively removing the protective layer, thereby opening the metal pad, forming a barrier layer on the entire surface of the substrate including the opened metal pad, wherein the barrier layer is formed to have a predetermined thickness, forming R, G, and B color filter layers on the barrier layer corresponding to the active area, forming a micro-lens over each of the color filter layers, and removing the barrier layer on the pad area. The example method may further include forming an insulating layer between the substrate and the metal pad, forming a first planarization layer between the barrier layer and the color filter layers and a second planarization layer between the color filter layers and the micro-lenses, and carrying out a first curing process, after opening the metal pad and before forming the barrier layer, so as to remove corrosive material that may corrode a surface of the metal pad.

The barrier layer may be formed of one of a PE oxide layer, a PE TEOS layer, and a PE nitride layer. The barrier layer may be formed to have a thickness in the range of 200 to 600 angstroms (Å). The metal pad may be formed of aluminum (Al).

The forming of the micro-lenses and the removing the barrier layer of the pad area may be performed simultaneously. Also, the method for fabricating the CMOS image sensor may further include, after removing the barrier layer of the pad area, performing an RIE curing process using $N_2$ gas to remove corrosive material that may remain on the surface of the metal pad.

Figure 1:
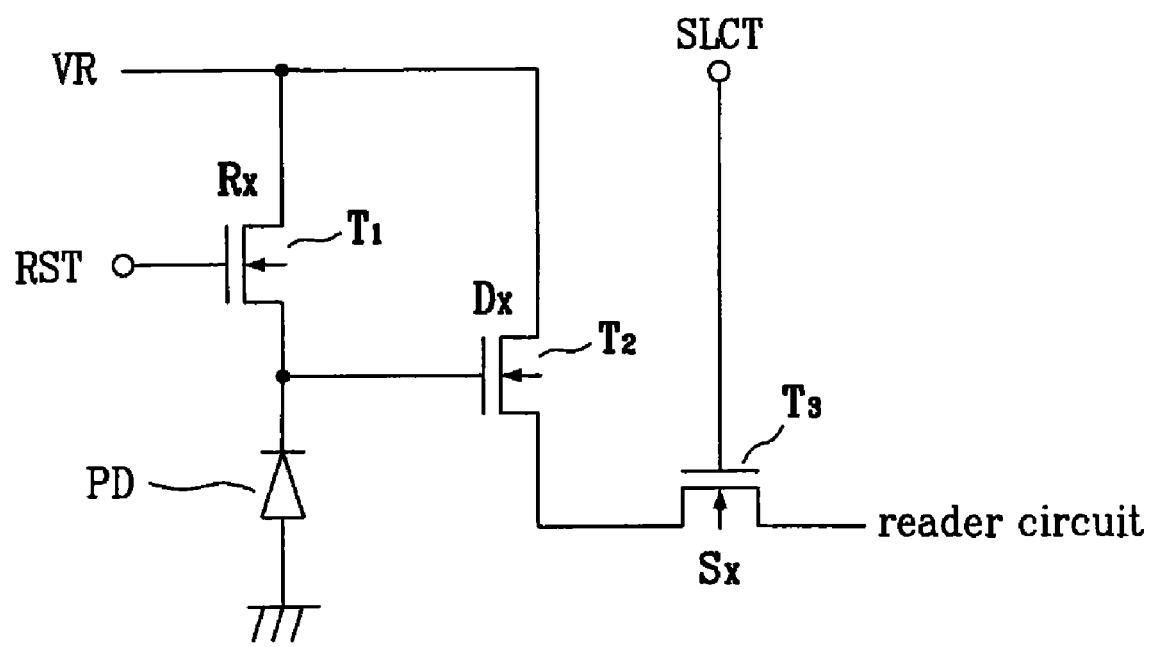
FIG. 1 illustrates an equivalent circuit diagram of a known CMOS image sensor.
Figure 2:
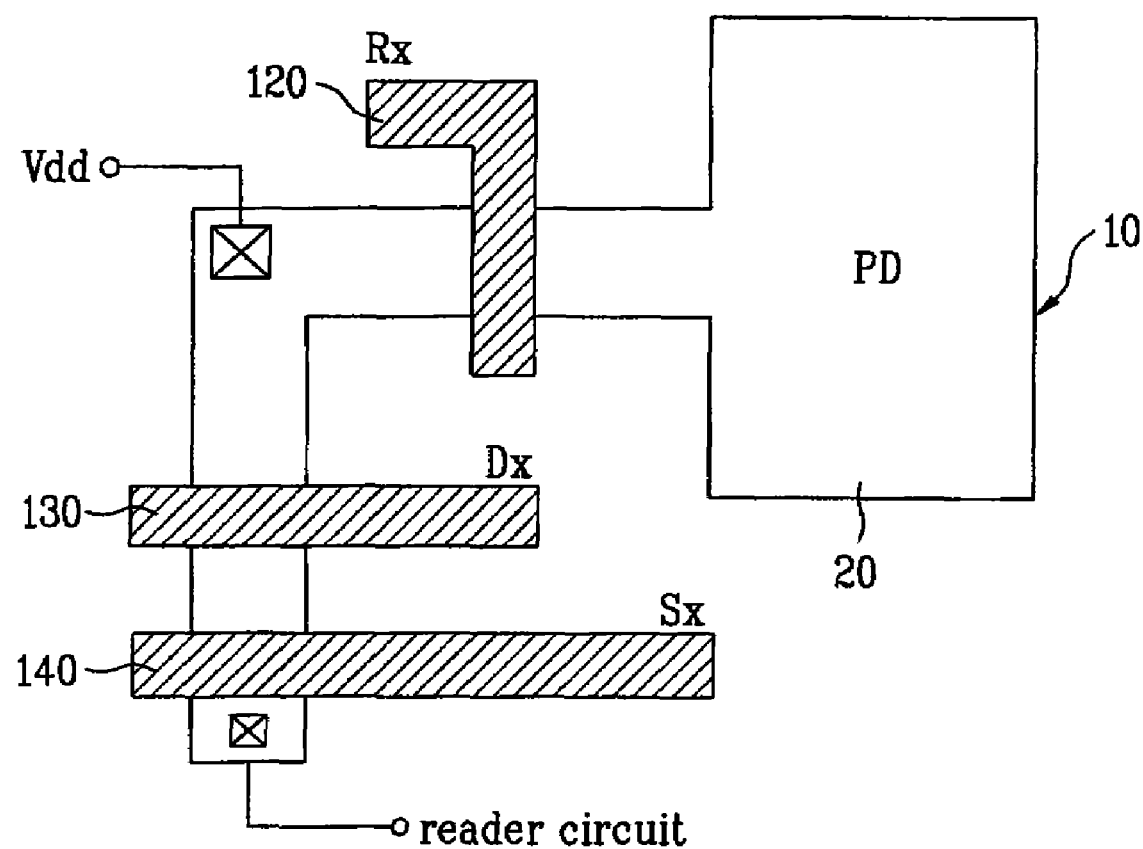
FIG. 2 illustrates a layout diagram of a known CMOS image sensor.
Figure 3A:
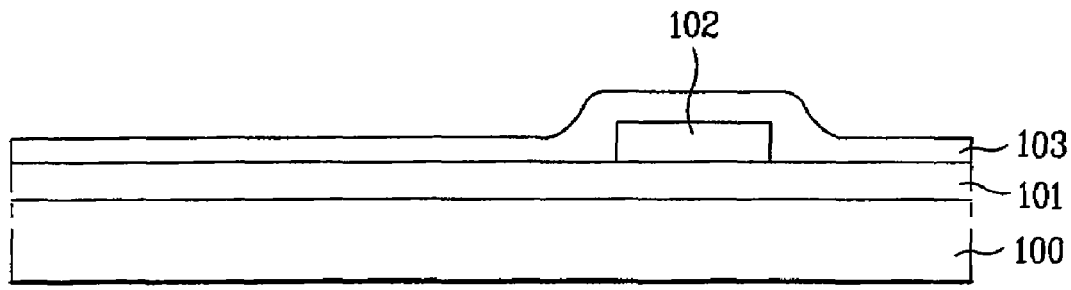
FIGS. 3A to 3E illustrate cross-sectional views of each signal line of a known CMOS image sensor and process steps of fabricating the known CMOS image sensor after forming the signal lines.
Figure 3B:
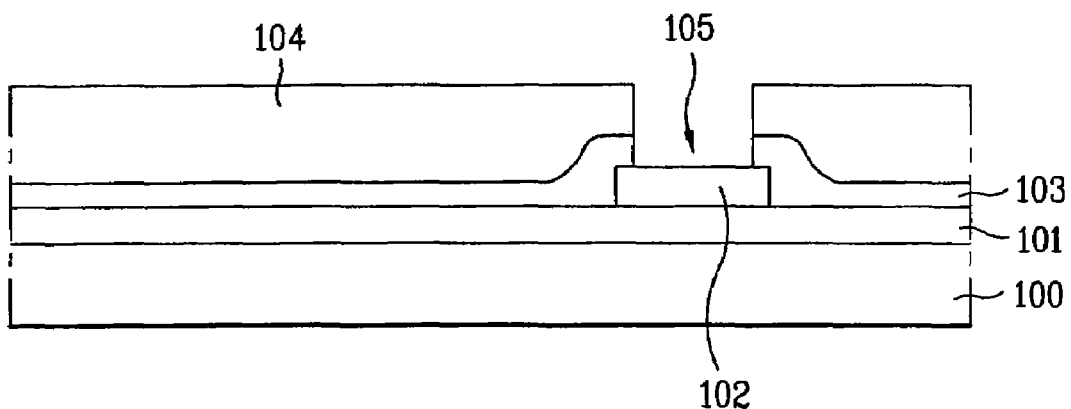
Figure 3C:
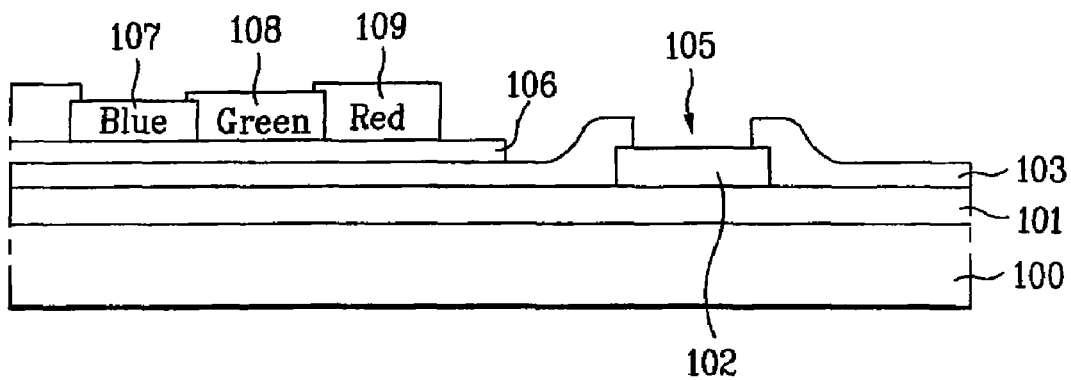
Figure 3D:
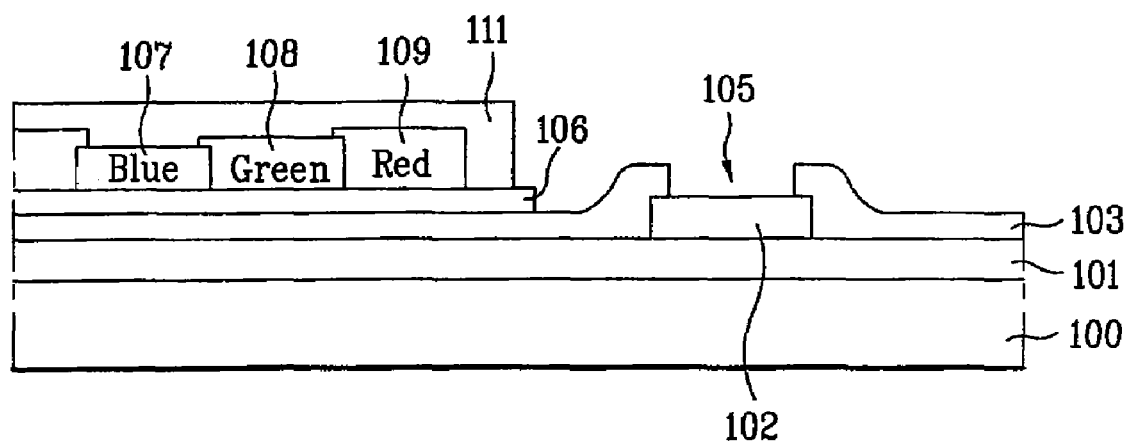
Figure 3E:
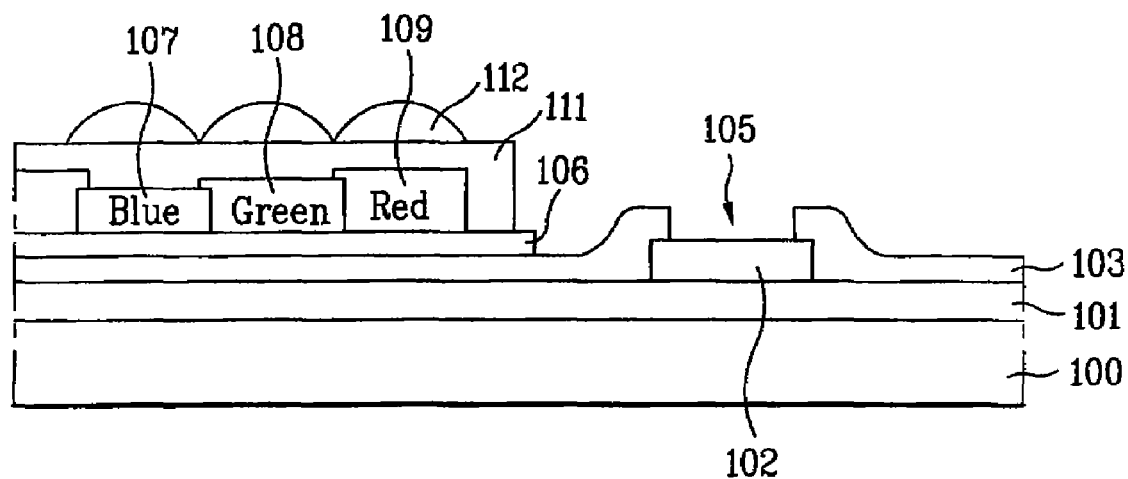
Figure 4A:
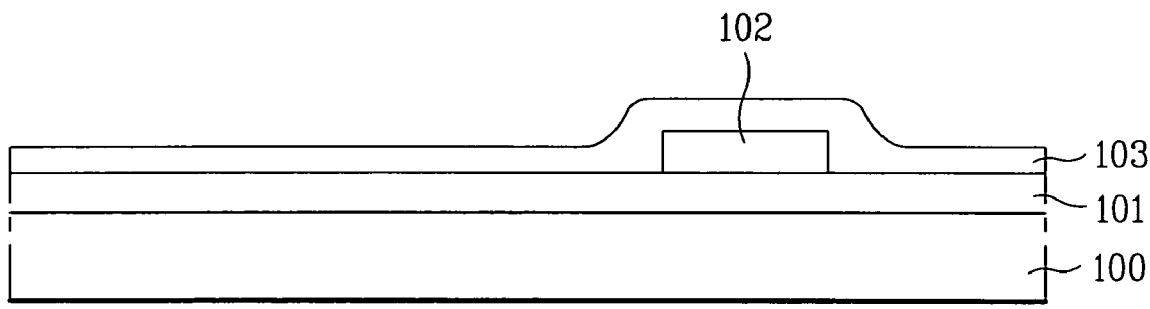
FIGS. 4A to 4F illustrate cross-sectional views of each signal line of an example CMOS image sensor and process steps of fabricating the example CMOS image sensor after forming the signal lines.

FIGS. 4A to 4F illustrate cross-sectional views of each signal line of an example CMOS image sensor and process steps of fabricating the example CMOS image sensor after forming the signal lines. Referring to FIG. 4A, an insulating layer 101, such as a gate insulating layer or an interlayer dielectric, is formed on a semiconductor substrate 100, and a metal pad 102 of each signal line is formed on the insulating layer 101. As shown in FIG. 2, the metal pad 102 may be formed of the same material as the gate electrodes 120, 130, and 140 and formed on the same layer. Alternatively, the metal pad 102 may also be formed of a different material through a separate contact and is usually formed of aluminum (Al). Also, a protective layer 103 is formed on an entire surface of the insulating layer 101 including the metal pad 102.

Figure 4B:
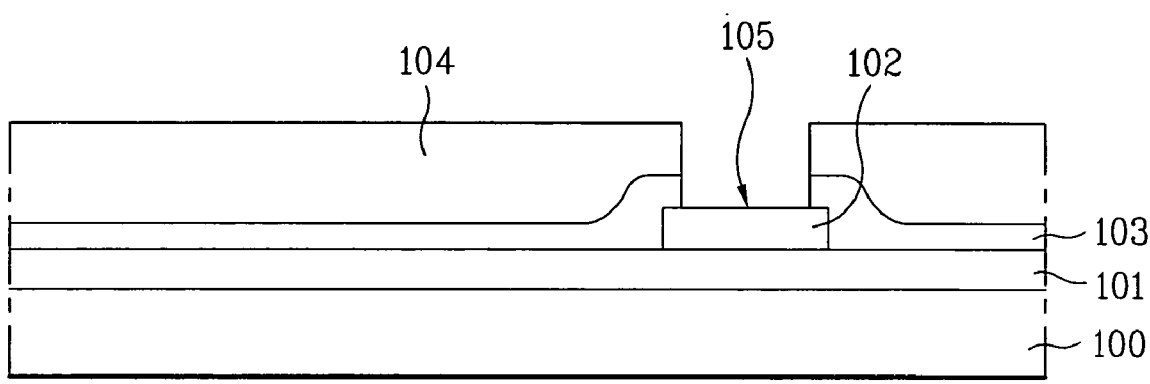

As shown in FIG. 4B, a photosensitive layer 104 is formed on the protective layer 103 and the photosensitive layer 104 is exposed and developed by using a photolithography process, thereby exposing an upper portion of the metal pad 102. Then, the protective layer 103 is selectively etched by using the photosensitive layer 104 as a mask to form an opening 105 on the metal pad 102. Finally, the photosensitive layer 104 is removed. Thereafter, when etching the protective layer 103, a corrosive material (e.g., fluorine) that corrodes the surface of the exposed metal pad 102 may remain. A first curing process (e.g., outgasing) is performed so as to remove the corrosive material that may remain.

Figure 4C:
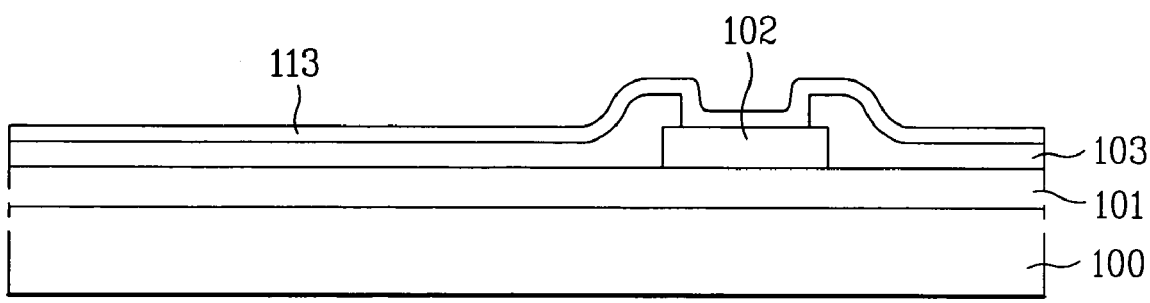

Referring to FIG. 4C, a barrier layer 113 is deposited on an entire surface of the substrate having the metal pad opening 105 formed thereon. The barrier layer 113 is formed of one of a plasma enhancement (PE) oxide layer, a PE TEOS layer, and a PE nitride layer and the barrier layer 113 is formed to have a thickness within the range of 200 to 600 angstroms (Å).

Figure 4D:
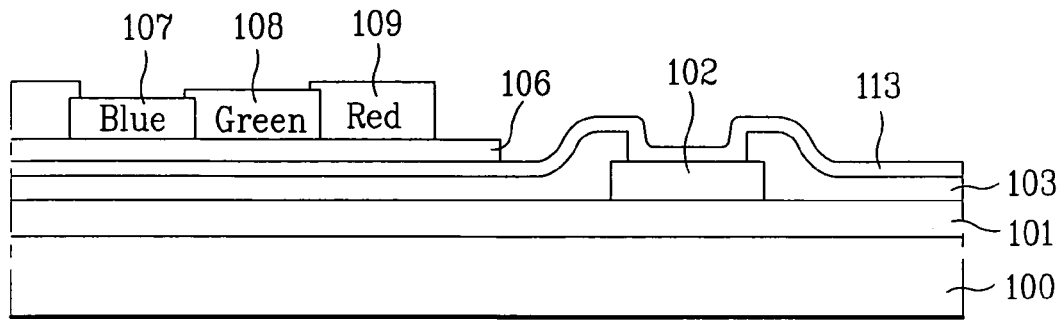

As shown in FIG. 4D, a first planarization layer 106 is deposited on the entire surface of the protective layer 103. By treating the first planarization layer 106 with a photo-etching process by using a mask, only the portion of the metal pad region is removed. Then, a blue color filter layer 107, a green color filter layer 108, and a red color filter layer 109 are serially formed on the first planarization layer 106 corresponding to each photodiode area (not shown). In the examples described herein, the color filter layers are formed by depositing the photoresist of the corresponding color and then treating the photoresist with a photo-etching process using a separate mask.

Figure 4E:
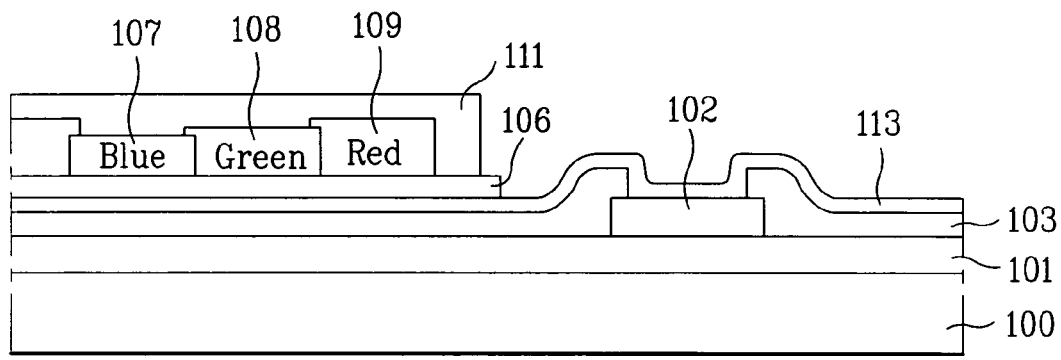

As shown in FIG. 4E, a second planarization layer 111 is formed on the entire surface of the substrate including the color filter layers 107, 108, and 109 and then the second planarization layer 111 is treated with a photo-etching process using a mask, so that the second planarization layer 111 remains only on the portion excluding the metal pad region.

Figure 4F:
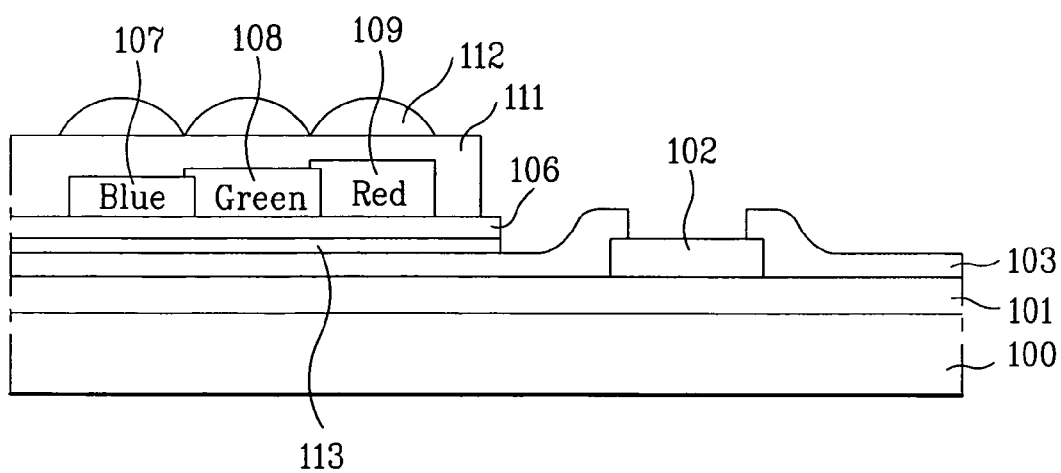

Referring to FIG. 4F, a dielectric material is formed on the second planarization layer 111, and a photo-etching process is carried out so as to selectively remove the dielectric material. Then, a micro-lens 112 corresponding to each color filter layer 107, 108, and 109 is formed. At this point, without adding a separate mask, the barrier layer 113 on the upper portion of the metal pad 102 is simultaneously removed by carrying out a blanket-etching process. In addition, when the barrier layer 113 is removed, fluorine ions, which may corrode the metal pad, may still remain on the metal pad 102. Therefore, an RIE curing process is carried out by using a $N_2$ gas, thereby removing all of the fluorine ions remaining on the surface of the metal pad 102.

Furthermore, although the example method described herein is described in connection with fabricating an image sensor, more specifically, a CMOS image sensor, the example method may also be applied in fabricating a CCD image sensor, a CMOS image sensor or a CMOS-like image sensor without limitations.

As described above, the example method for fabricating the CMOS image sensor advantageously provides a barrier layer for protecting a metal pad from developing solutions or etching solutions used in later processes. As a result, the metal pad is protected from corrosion, thereby reducing contact resistance of the metal pad. In addition, because the contact resistance of the metal pad is reduced during the probe test, a deep probing process, which cuts out a surface of the metal pad, is not required, thereby preventing the photodiode function from being incapacitated due to metal pad particles.

Although the example apparatus and methods described herein are suitable for a wide scope of applications, they are particularly suitable for reducing metal pad particles formed during a pad probing process, thereby providing a high quality image sensor having enhanced light receiving characteristics.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for fabricating a complementary metal-oxide semiconductor (CMOS) image sensor, comprising:
    forming a metal pad in a pad area of a substrate having an active area and a pad area defined thereon;
    forming a protective layer on an entire surface of the substrate including the metal pad and selectively removing the protective layer to open the metal pad;
    forming a barrier layer having a predetermined thickness on the entire surface of the substrate including the opened metal pad;
    forming color filter layers on the barrier layer corresponding to the active area;
    forming a micro-lens over each of the color filter layers; and
    after forming the color filter layers on the barrier layer, removing the barrier layer on the pad area.

2. The method of claim 1, further comprising forming an insulating layer between the substrate and the metal pad.

3. The method of claim 1, further comprising, before forming the color filter layers, forming a first planarization layer on the barrier layer, and after forming the color filter layers, forming second planarization layer on the color filter layers, before forming the micro-lenses.

4. The method of claim 1, further comprising carrying out a first curing process after opening the metal pad and before forming the barrier layer.

5. The method of claim 1, wherein the barrier layer comprises a PE oxide layer, a PE TEOS layer, or a PE nitride layer.

6. The method of claim 1, wherein the barrier layer has a thickness in the range of 200 to 600 angstroms.

7. The method of claim 1, wherein the metal pad comprises aluminum.

8. The method of claim 1, wherein forming the micro-lenses and removing the barrier layer of the pad area are performed simultaneously.

9. The method of claim 1 further comprising, after removing the barrier layer from the pad area, performing an RIE curing process using $N_2$ gas to remove corrosive material that may remain on the surface of the metal pad.

10. The method of claim 4, wherein the first curing process removes corrosive material that may corrode a surface of the metal pad.

11. The method of claim 10, wherein the corrosive material comprises fluorine.

12. The method of claim 1, wherein the color fitter layers comprise red, green, and blue color filters.

13. The method of claim 1, further comprising, forming a first planarization layer on the barrier layer, then forming the color filter layer on the first planarization layer.

14. The method of claim 13, further comprising, forming a second planarization layer on the color filter layer, then forming the micro lenses on the second planarization layer.

15. The method of claim 1, wherein forming the barrier layer comprises plasma enhanced deposition.

16. The method of claim 1, wherein removing the barrier layer comprises a blanket-etching process.

17. The method of claim 1, wherein the barrier layer comprises an oxide layer.

18. The method of claim 1, wherein the barrier layer comprises a PE TEOS layer.

19. The method of claim 1, wherein the barrier layer comprises a nitridee layer.

20. The method of claim 1, wherein the metal pad comprises a gate electrode material or aluminum.

* * * * *